(12) United States Patent
Jacobs et al.

(10) Patent No.: US 10,081,536 B2
(45) Date of Patent: Sep. 25, 2018

(54) GASSES FOR INCREASING YIELD AND RELIABILITY OF MEMS DEVICES

(71) Applicant: Texas Instruments Incorporated, Dallas, TX (US)

(72) Inventors: Simon Joshua Jacobs, Lucas, TX (US); Molly Nelis Sing, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/379,401

(22) Filed: Dec. 14, 2016

(65) Prior Publication Data

US 2018/0162721 A1  Jun. 14, 2018

(51) Int. Cl.
| | | |
|---|---|---|
| *H01L 29/12* | (2006.01) | |
| *H01L 29/84* | (2006.01) | |
| *H01L 23/10* | (2006.01) | |
| *B81B 7/00* | (2006.01) | |
| *B81C 1/00* | (2006.01) | |
| *B81B 7/02* | (2006.01) | |
| *H01L 23/20* | (2006.01) | |

(Continued)

(52) U.S. Cl.
CPC .............. *B81B 7/0038* (2013.01); *B81B 7/02* (2013.01); *B81C 1/00214* (2013.01); *B81C 1/00285* (2013.01); *H01L 21/56* (2013.01); *H01L 23/10* (2013.01); *H01L 23/20* (2013.01); *H01L 29/12* (2013.01); *H01L 29/84* (2013.01); *B29C 65/48* (2013.01); *B81B 2201/042* (2013.01); *B81C 2201/11* (2013.01); *H01L 21/67* (2013.01)

(58) Field of Classification Search
CPC ......... H01L 29/12; H01L 29/84; H01L 23/10; H01L 23/20; H01L 21/56; H01L 21/67; B81B 7/02; B81B 7/0038; B81B 2201/042; B81C 1/00214; B81C 1/00285; B81C 2201/11; B29C 65/48
USPC ............... 257/414, 415, 678, 682, E29.324, 257/E23.137, E23.138, E21.501, E21.502; 252/194, 500, 520.3; 156/379.7; 438/51, 438/108, 127, 156
See application file for complete search history.

(56) References Cited

U.S. PATENT DOCUMENTS

| | | | |
|---|---|---|---|
| 6,843,936 B1 * | 1/2005 | Jacobs .................. | B01D 53/28 252/194 |
| 2007/0001247 A1 * | 1/2007 | Patel ..................... | B81B 7/0077 257/414 |

(Continued)

FOREIGN PATENT DOCUMENTS

WO        9315973 A1     8/1993

OTHER PUBLICATIONS

International Search Report for PCT/US2017/066476 dated Apr. 19, 2018.

*Primary Examiner* — Dao H Nguyen
(74) *Attorney, Agent, or Firm* — Michael A. Davis, Jr.; Charles A. Brill; Frank D. Cimino

(57) ABSTRACT

In described examples, a MEMS device is enclosed within a sealed package including nonmetal oxide gasses at levels greater than 1% by volume. In at least one example, the MEMS device is protected against premature failure from various causes, including charging, particle growth and stiction by moieties of the nonmetal oxide gasses reacting with various exposed surfaces within the package of the MEMS device and/or the adsorbed water layers on said surfaces.

32 Claims, 2 Drawing Sheets

(51) Int. Cl.
  *H01L 21/56* (2006.01)
  *B29C 65/48* (2006.01)
  *H01L 21/67* (2006.01)

(56) References Cited

U.S. PATENT DOCUMENTS

| | | |
|---|---|---|
| 2007/0172991 A1 | 7/2007 | Schaadt |
| 2007/0295456 A1* | 12/2007 | Gudeman ............ B81C 1/00269 |
| | | 156/379.7 |
| 2008/0141759 A1* | 6/2008 | Reinert ................. G01M 3/186 |
| | | 73/40 |
| 2008/0169521 A1* | 7/2008 | Foster ................... B81B 7/0041 |
| | | 257/415 |
| 2009/0256251 A1 | 10/2009 | Getz et al. |
| 2013/0330878 A1 | 12/2013 | Ararao |
| 2014/0038364 A1* | 2/2014 | Nicolas ............... B81C 1/00285 |
| | | 438/127 |
| 2016/0272486 A1* | 9/2016 | Shin, II .................... B81B 7/02 |
| 2016/0297674 A1 | 10/2016 | Man et al. |

* cited by examiner

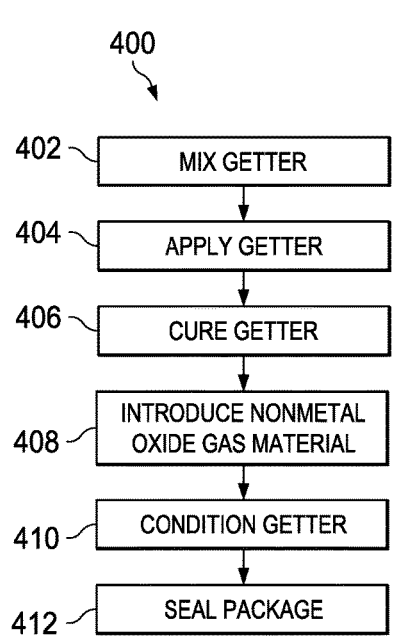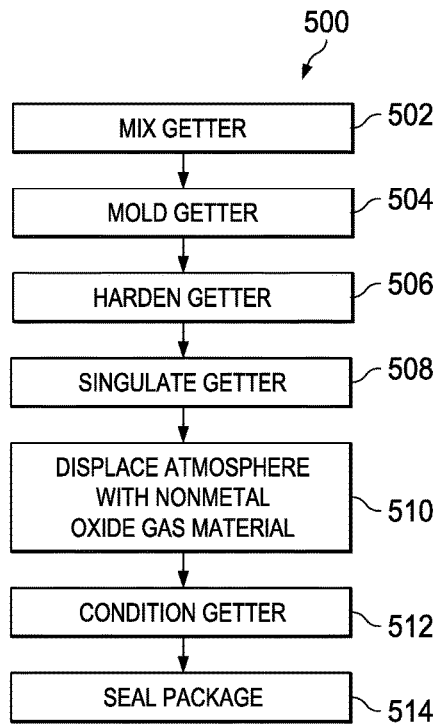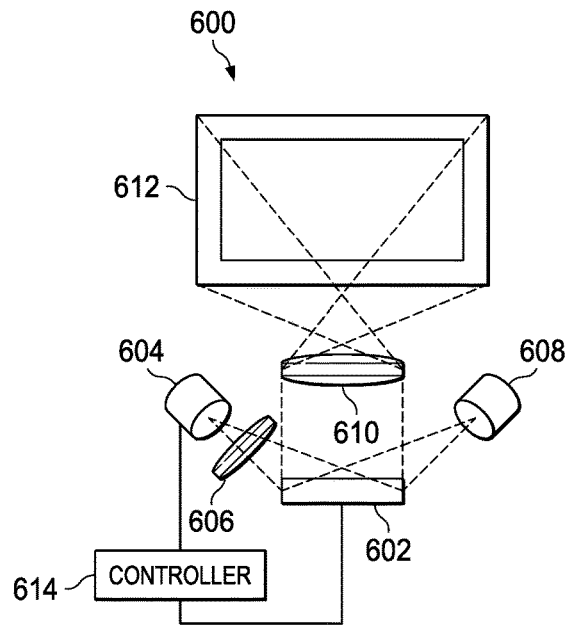

GASSES FOR INCREASING YIELD AND RELIABILITY OF MEMS DEVICES

BACKGROUND

Electronic devices such as integrated circuits are often packaged in sealed enclosures. These enclosures protect the device from contaminants, particles and water vapor that would otherwise enter the package and mechanically damage or electrically disrupt the device. Various MEMS (microelectromechanical system) devices include moving components and structures (such as micro-miniaturized) that place unique demands on the environment in which the MEMS devices are placed. Operation of the MEMS devices over time (even in a sealed packaged environment) can result in physical changes to various structures of a MEMS device, which often leads to degraded performance or even failure of the so-affected MEMS device.

SUMMARY

In described examples, a MEMS device is enclosed within a sealed package including nonmetal oxide gasses at levels greater than 1% by volume concentration. In at least one example, the MEMS device is protected against premature failure from various causes, including charging, particle growth and stiction by moieties of the nonmetal oxide gasses reacting with hydrogen bonds of a surface layer of water on exposed surfaces of the MEMS device.

BRIEF DESCRIPTION OF THE DRAWINGS

FIG. 4 is a flow diagram for applying a viscous getter compound in accordance with example embodiments.

FIG. 5 is a flow diagram for applying a singulated getter compound in accordance with example embodiments.

FIG. 6 is a schematic diagram of an image projection system using a micromirror in accordance with example embodiments.

DETAILED DESCRIPTION

Figure 1:
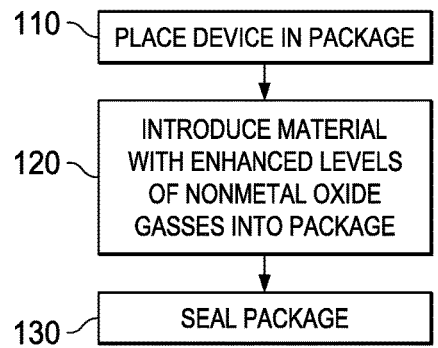
FIG. 1 is a flow diagram for including certain gasses within a MEMS device packaged in accordance with example embodiments.

In this description, a system can be a sub-system of yet another system.

Also, in this description, if a first device couples to a second device, that connection can be made through a direct electrical connection, or through an indirect electrical connection via other devices and connections. The term "portion" can mean an entire portion or a portion that is less than the entire portion. The term "gas" (or "gasses") can mean an element or molecule capable of existing in a gaseous state, even when such an element or molecule can be found in an alternate state, such as at room temperature and pressures. The term "package" can mean a sealed container, which can include die, wafers or even larger equipment including MEMS devices in a local environment that is sealed from an outside environment.

A "nonmetal" is an element (in accordance with common usage) generally regarded to be selected from the below-listed elements from selected groups of the periodic table: Group 1 listed elements include hydrogen (H); Group 14 listed elements include carbon (C); Group 15 (the pnictogens) listed elements include nitrogen (N) and phosphorus (P); Group 16 (the chalcogens) listed elements include oxygen (O), sulfur (S), and selenium (Se); Group 17 (the halogens) listed elements include all the group elements fluorine (F), chlorine (Cl), bromine (Br), iodine (I), and astatine (At); and Group 18 (the noble gases) listed elements include all the group elements helium (He), neon (Ne), argon (Ar), krypton (Kr), xenon (Xe), and radon (Rn).

"Nonmetal oxides" generally refer to binary compounds between a nonmetal element and oxygen in any stoichiometry. Nonmetal elements typically form acidic oxides; accordingly, they are compounds made up of a nonmetal element and oxygen that when dissolved in water result in a solution with a pH<7. In contrast, metals generally form basic oxides.

The term "acidic solute(s)" can mean a nonmetal oxide or its reaction product(s) with water.

The term "nonmetal oxide gas," in accordance with commonly accepted usage, does not normally include dihydrogen oxide (water), the halogen oxides (most of which are not isolable or stable), and the noble gasses (which do not form oxides). Accordingly, the term "nonmetal oxide gas" includes as oxides of carbon, nitrogen, oxygen (e.g., $O_2$), and sulfur (which are gasses or liquids with substantial vapor pressures at standard pressures and temperatures) and phosphorus and selenium (whose oxides are sublimable solids at STP). In an embodiment, preferred species of nonmetal oxide gasses include oxides of carbon, nitrogen, oxygen (e.g., $O_2$) and sulfur, and an especially preferred species is carbon dioxide, $CO_2$ (whereas carbon monoxide does not dissolve to 0.001 molar in accordance with a threshold described below).

The term "nonmetal" also can mean an element having a generally common spectrum of behavior in which certain general properties are considered characteristics of nonmetals.

As described herein, nonmetal oxide gasses are introduced into the headspace of MEMS devices to increase yield and reliability of the MEMS devices.

Many MEMS devices (including radio frequency MEMS devices) are subject to premature failure from various causes including charging, particle growth and stiction. The charging can result when charges are localized (and/or displaced) during processing (and/or actuation) of the MEMS device, so self-biasing, latching and permanent stiction can occur.

The particle growth can occur from free substances released or created due to operation of the structures, or from materials such as adhesives, sealants and getter compounds. In the MEMS device, some parts are intended to move, but particles might undesirably interfere with (e.g., reduce the range of) that movement. Those particles are potentially created by: formation of metal particles via packaging processes or spalling due to contact during operation; metal oxide particles due to spalling or corrosion reactions (e.g., converting a zero-valent metal into an oxide, hydroxide or sulfide); or other conditions that can occur during the processing and operation of the MEMS device.

Stiction is static (or "sticky") friction resulting from a combination of forces, including electrostatic forces, hydrogen bonding and van der Waals forces. As described herein, the inclusion (at greater than 1.0% concentrations by volume) of non-metal oxides ("included gasses") within the package headspace of the MEMS device alters the electrochemical and corrosion behavior of structures during packaging and operation of the MEMS device in accordance with various behaviors.

In accordance with a first behavior, the included gasses react with a portion of adsorbed water on the surface of the MEMS devices to form acid substances. For example, moisture (e.g., from humidity) in the package cavity forms hydrogen bonds with the surface of the MEMS device to form a latticework (e.g., surface layer) of hydrogen-bonded water molecules on the surface of the MEMS device. When the included moieties are oxides of carbon, sulfur or nitrogen, the formed acids can include acids, such as carbonic, sulfonic, nitrous, nitric and sulfuric acids.

In accordance with a second behavior, the included gasses achieve a surface equilibrium concentration of ionic species through dissociation of the acid molecules, producing surface ionic species (e.g., hydronium ions and carbonate species). For example, the acid molecules can dissociate, thereby forming hydronium ions (e.g., proton donor) and/or carbonate species (proton acceptors). Such species can interact (e.g. by dissolution, dissociation and/or hydrogen bonding) with the surface-layer of water molecules. In accordance with general chemical principles such as Le Chatlier's Principle, an equilibrium is reached between relative concentrations of the gasses in the headspace of the MEMS device and the ionic species in the surface layer.

In accordance with a third behavior, the included gasses facilitate the transference of charge by a relatively rapid exchange of hydrogen bonds. For example, charges (such as charges that would otherwise be localized) cause rapid formation and reformation of hydrogen bonds, so those charges in a charged MEMS device are more rapidly dispersed by the formation of new hydrogen bonds with (such as adjacent) solute proton donors (such as acid species).

In accordance with a fourth behavior, the included gasses reduce the Debye length of the adsorbed surface water layers. For example, the equilibrium involving inclusion of the gas species introduces proton donors in the surface layer, thereby reducing the Debye length of the surface water layer, so that the net van der Waals forces between the contacting surface layers of the MEMS device are reduced.

In accordance with a fifth behavior, the included gasses suppress or delay corrosion of the MEMS device or package surfaces resulting from chemical (including electrochemical) reduction/oxidation reactions of surfaces of the MEMS device or package. For example, a buffer medium (e.g., "solution") is formed by the dissociated acids (resulting from the included gasses) combining with surface hydroxide (resulting from reduction reactions at a metal surface). The buffer medium (e.g., which is a hydrogen ion buffer) regulates surface reactivity and pH values (such as in exposed MEMS), which slows corrosion reaction rates of materials within the surface of the MEMS device. Secondary chemical reactions between the products of various surface chemical (and electrochemical) reactions include conjugate bases (such as hydroxide ions and bicarbonate ions) and acids (such as formic acid), which further act to buffer or mitigate such corrosion reactions.

As described herein, the inclusion (at concentrations of at least 1%) of selected nonmetal oxide gasses are gasses dissolving readily in water to produce ionic species capable of supporting and/or participating in electrochemical reactions. Examples of such gasses (suited for undergoing electrochemical oxidation and reduction) include carbon dioxide, oxides of sulfur, and oxides of nitrogen. In an embodiment, a gas suitable for inclusion in a MEMS device package as described herein is characterized by a water solubility at STP (standard temperatures and pressure) sufficient to provide at least a 0.001 molar solution in water.

FIG. 1 is a flow diagram 100 for including certain gasses within a MEMS devices packaged in accordance with example embodiments. In step 110, a MEMS device is placed in a package (e.g., for packaging operating electronic devices), or alternatively elements of the package are formed around the MEMS device. In step 120, a material is introduced in the package. Such material includes enhanced levels (e.g., targeted above 1% concentration by volume) of nonmetal oxide gas molecules for generating acidic and/or ionic species (e.g., "solute material"). In at least one embodiment, step 112 optionally occurs before step 110. In step 130, the package is sealed, so that exposed surfaces of the MEMS device remain exposed to nonmetal oxide gas at levels greater than 1% by volume in the package. The nonmetal gas oxide molecules can exert the effects of the above-named behaviors at any time during the packaging process or after the package is sealed, serving to deter certain chemical reactions throughout.

In a "backfill" embodiment for introducing a desired gas or gas mixture to the headspace, existing gas (e.g., in the package, process cavity and/or chamber where the sealing step occurs) is evacuated and backfilled with the desired gas mixture at a desired pressure. In a "purging" embodiment for introducing a desired gas or gas mixture to the headspace, the process cavity and/or chamber is filled with the desired gas mixture for a period of time before the sealing operation. The previous concentrations are purged, such as through diffusion into the introduced gasses for the desired gas mixture.

In various embodiments, air (e.g., having various gasses in typical atmospheric proportions) and/or adventitious gasses that can exist in the package cavity are displaced by introducing materials having enhanced levels (e.g., having concentrations above 1% by volume) of gas molecules for generating acids (e.g., solute materials) in the packaging process. The solute materials include one or more of a nonmetal oxide (acidic) gas (e.g., carbon dioxide), a nonmetal oxide (acidic) gas precursor (e.g., one or more materials for releasing and/or generating carbon dioxide), and an enhanced getter (e.g., for carrying the acidic gas or the acidic gas precursors, surface tension modifiers, and dehydrators). The type(s) of gasses for producing acidic solute moieties are selected from the group of nonmetal oxides, and such solute moieties include carbonic, sulfonic, nitrous, nitric, and sulfuric acids. The gasses are included in sufficient (e.g., above 1%) concentrations, so as to provide a source (such as a virtually inexhaustible source) of the gas proton donor species over the expected lifecycle of the packaged MEMS device.

Figure 2:
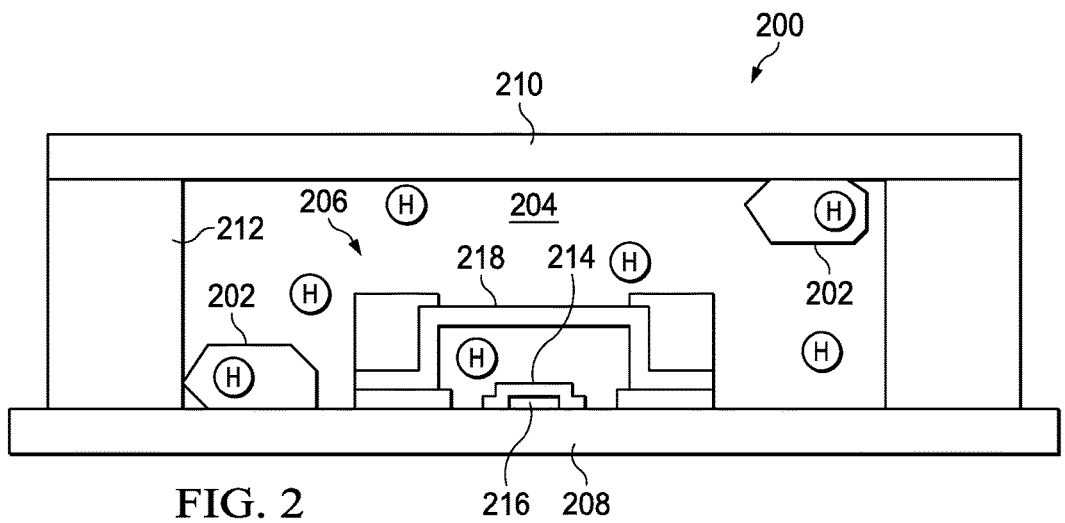
FIG. 2 is a cross-section diagram of a microelectromechanical device package in accordance with example embodiments.

FIG. 2 is a cross-section diagram of a microelectromechanical device package 200 in accordance with example embodiments. Generally, a package substrate 208, a spacer ring 212, and a package lid (or window) 210 are sealed to provide a sealed environment for an enclosed MEMS device 206. Before sealing the enclosed MEMS device 206 within the package 200, at least a portion (e.g., in standard proportions) of the atmospheric gasses or other adventitious gasses in the headspace 204 are displaced or removed by a gas or gas mixture containing a material for acidic solutes, an example of which includes one or more of gas, a precursor (such as solid carbon dioxide), and a getter for liberating easily soluble acidic solutes (e.g., proton-donor species) within the headspace 204 of the package 200. As described hereinabove, precursors to the easily soluble nonmetal oxide species can be included as a portion of the included easily soluble nonmetal oxide species. Such precursors can be included in the getter compound 202. For example, an easily soluble nonmetal oxide species, H, is a species capable of being dissolved in water at a concentration of at least 0.001 molar and which, when dissolved at this or greater concentration, results in an acidic pH.

For example, depending on methods of getter application, the getter compound 202 is optionally extruded in the form of a precursor liquid or paste material onto any suitable internal package surface. Also, for example, the package substrate 208, a package lid (or window) 210, and/or a spacer ring 212 can all be substrates on which getter precursor material is dispensed. The mixture 202 can be applied in dots, strips or any other shape or form that does not interfere with normal operation of the device.

For example, when the mixture 202 is applied to the package window 210, a portion of the package window 210 is left clear (e.g., unobstructed by the applied getter compound 202), so an aperture remains through which light can pass. Normally, a drying or curing period can elapse while the getter precursor material evolves (e.g., outgasses) solvent, cures or otherwise attains its desired shape and composition. Optionally, the getter compound 202 is applied directly to a surface enclosed by the package headspace without the use of a solvent. Before completing sealing of the package (as in operation 130 described hereinabove), additional chemical or physical conditioning is applied to the getter to introduce additional desired components (such as lubricants and surface tension modifiers) in accordance with a particular kind of MEMS device enclosed within the package 200. The introduction of such additional desired components is described in U.S. Pat. No. 5,939,785, which is hereby incorporated by reference herein.

The nonmetal oxides H interact with a surface layer of moisture (e.g., a hydrogen-bonded ice-like lattice), which forms on surfaces (e.g., exposed surfaces) of the MEMS device 206. As described herein, the easily soluble nonmetal oxide species H promote protection of the surfaces of the MEMS device 206 covered by an adsorbed surface layer of moisture. For example, the MEMS device 206 includes a dielectric layer 214 (e.g., deposited over and covering a center electrode 216) and a horizontal beam 218. The horizontal beam 218 is operable to move (e.g., flex) relative to one or more surrounding structures, such as in response to a charge applied to the center electrode 216 beneath the dielectric layer 214. As described hereinbelow with reference to FIG. 3, the easily soluble nonmetal oxide species H interact with a surface layer of moisture adsorbed on surfaces of the dielectric layer 214 and the horizontal beam 218.

Figure 3:
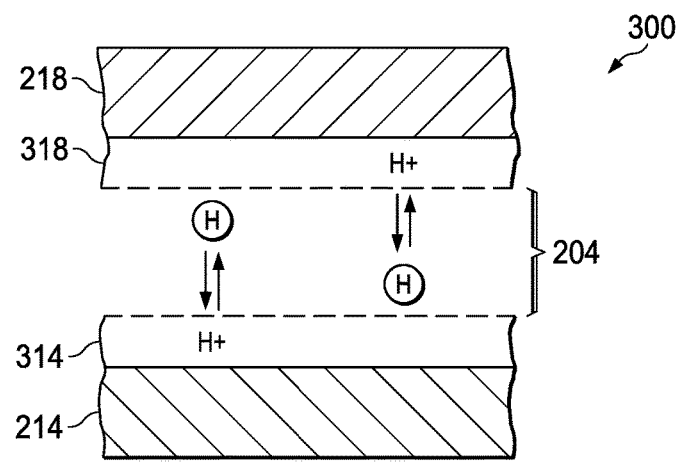
FIG. 3 is a cross-section diagram of an enlarged portion of the MEMS device in accordance with example embodiments.

FIG. 3 is a cross-section diagram of an enlarged portion 300 of the MEMS device 206 in accordance with example embodiments. For example, the enlarged portion 300 includes portions of the horizontal beam 218 and the dielectric layer 214. Hydrogen-bonded adsorbed surface layers 318 and 314 (in equilibrium with water molecules in headspace 204) form an ice-like lattice work of hydrogen-bonded water molecules. Depending on the relative humidity inside the package, the hydrogen-bonded surface layers 318 and 314 can be one to several water molecules thick before surface tension of water causes liquefaction of a portion of the water molecules in the surface layer.

The hydrogen-bonded surface adsorbed water layers form on all interior surfaces (e.g., exposed interior surfaces). Such layers 318 and 314 respectively are formed on the exposed surfaces of the horizontal beam 218 and the dielectric layer 214. Because the exposed surfaces of the hydrogen-bonded surface water layers 318 and 314 remain exposed to the headspace 204, easily soluble acidic gasses (e.g., for providing acidic solute species H) are free to dissociate into ionic species ("H+") in the device surface layers 318 and 314, such as where the positive ionic species H+ are formed and subsequently enter the hydrogen-bonded surface layers 318 and 314 to form acids. The acids are formed when the solute materials dissolve or mix with the surface layers of water.

Positive ionic species H+ are not localized, due to rapid equilibration of hydrogen bonds. Accordingly, a portion of the charge due to positive ionic species H+ is released (e.g., traveling through at least a portion of a surface layer 318 or 314) as the hydrogen bonds break and reform over time. A first portion of the acidic solute returns to the headspace 204, and an equilibrium is reached in accordance with relative concentrations of the gasses in the headspace of the MEMS device and the ionic species in the surface layer. A second portion of the released ionic species influences the reformation of the hydrogen bonds of the surface layer and is recaptured by a rearrangement (e.g., breaking and reforming) of hydrogen bonds in the surface layer.

Accordingly, the included nonmetal oxide gasses (e.g., for producing the acidic species) can facilitate the transference of charge by a relatively rapid exchange of hydrogen bonds. In operation, the capacitance of the MEMS device is varied with respect to a change in the distance between the beam 218 and the dielectric layer 216. Residual charge of the dielectric 214 is at least partially reduced by transferring stored charge from the dielectric 214 to the hydrogen bonds formed in the surface layer 314. Reducing the residual charge in the dielectric 214 and the horizontal beam 218 reduces the incidence of stiction and particle growth between the beam 218 (such as a flexible beam) and the dielectric 216. In absence of said acidic solutes within surface layer 318 or 314, electrostatic failure can occur as a result of accumulated charge causing self-latching of the beam 218.

Stiction is also reduced in accordance with the inclusion of the gas species proton donors. The gas species proton donors reduce the Debye length of the adsorbed water layers, so that the net van der Waals forces between the surface water layers of the MEMS device are reduced (e.g., reducing the adhesion of the contacting of surface layer 314 and 318 resulting from the beam 218 flexing).

Further, rates of corrosion of the dielectric 214 and/or beam 218 are diminished by the inclusion of the gas species proton donors within the surface layers (e.g., 314 and 318) of exposed surfaces within the sealed cavity including the MEMS device 206. For example, the rates of corrosion are slowed by the acidic and ionic species formed in the surfaces of the MEMS device due to the inclusion of the easily soluble nonmetal oxide species H.

The following example describes a contributory mechanism for damage of the MEMS device. During operation in which opposing surfaces of the MEMS device move and/or contact, small fissures can form in protective native oxides (which normally cover the metal layers). The newly formed fissures expose the underlying metal atoms. Many metals, including structural metals of contemplated MEMS devices, are subject to spontaneous redox reactions with water. In such reactions, hydrogen gas and hydroxide ions are formed. These hydroxide ions can, in turn, further attack the native oxide surface, which exposes an even greater amount of zero-valent metal. Accordingly, the degradation reactions become autocatalytic, which greatly accelerates the performance degradation and often results in inferior quality and less reliable MEMS devices.

For example, the easily soluble nonmetal oxide species H can react with bases that otherwise would have reacted with the exposed structures of the MEMS devices 206 (e.g., causing corrosion of the exposed structures of the MEMS device 206 as described hereinabove). Oxygen gas ($O_2$) can also potentiate such reactions by reaction with the exposed zero-valent metal. The reaction of oxygen and zero-valent metal can occur directly, or it can be mediated or enhanced by a surface water layer. Often, the products of reaction of oxygen with zero-valent metal and water with the same zero-valent metal are different in composition. However, any of these metal oxide products can contribute to repair or masking of the fissures described hereinabove.

FIG. 4 is a flow diagram 400 for applying a getter compound in accordance with example embodiments. The getter compound (getter) is optionally a polymer-zeolite mixture. The polymer-zeolite mixture is a compound including polymer, zeolite and an optional solvent, which are mixed in operation 402 and applied in operation 404 to a surface of the package or lid (e.g., to be sealed within the package in operation 412). The mixture can be dispensed on any surface to be included within in the package interior after assembly is complete, including a non-moving area and/or section of the MEMS device (e.g., so that the functionality of the MEMS device is not substantially degraded). The polymer-zeolite mixture is cured in operation 406. The cure process 406 is for hardening the polymer-zeolite mixture, so that (in at least one example) the hardened mixture does not flow or otherwise move from an intended position.

After the polymer-zeolite mixture is cured in operation 406 (where the polymer-zeolite mixture is optionally further conditioned in step 410), a nonmetal oxide gas is introduced to the package in operation 408. The nonmetal oxide gas material (e.g., including gasses relatively easily dissolved in water for providing ionic species for generating acidic solutes) can be applied to the getter and/or headspace of the package as a vapor, as a liquid, or as a sublimable solid (e.g., solid $CO_2$-"dry ice"). Accordingly, the getter and the acids (relatively easily dissolved in water for providing ionic species for generating acid solutes) can be introduced at the same time or at different times.

The polymer-zeolite mixture is conditioned in operation 410 to set the initial acid content of the zeolite mixture. The conditioning operation 410 usually includes exposing the getter to the solute materials or their precursors for a period of time to introduce the gas content into the polymer of the getter (e.g., so that, during actual use of the MEMS device, the getter can act as a source and a sink of acid solute material).

After the period of time, the package is sealed as indicated by operation 412. The package is optionally hermetically sealed, such as to prevent infiltration of moisture (e.g., from humidity in the surrounding atmosphere) and exfiltration of portions of the acid solute material. A hermetically sealed package can optionally be leak tested by mixing a quantity of helium with the desired acid solute material. The included helium penetrates small leaks rapidly, is chemically inert, and is readily detected by mass spectrometry. In a preferred embodiment, the helium exists in a range of 1% by volume to 20% by volume. After the sealing operation, the package is heated, which facilitates the establishment of chemical equilibrium among the species within the package headspace.

FIG. 5 is a flow diagram 500 for applying a singulated getter compound in accordance with example embodiments. The getter compound (getter) is optionally a polymer-zeolite mixture. The polymer-zeolite mixture is a compound including polymer, zeolite and an optional solvent (such as hexanol), which are mixed in operation 502 to form a viscous getter compound. Although the operations of flow diagram 500 are described sequentially, portions of the operations are combinable and/or performable in different orders to achieve results similar to the described operations.

In operation 504, the viscous getter compound is molded (e.g., cast) into intended shape(s). In operation 506, the viscous getter compound is hardened, such as by evaporation of the solvent (e.g., so that the hardened mixture can be cut, moved and installed without substantially changing the shape of the hardened mixture). In operation 508, the hardened getter compound is optionally singulated by cutting the hardened getter compound into dibs (or alternatively, the intended shape of operation 504 can be a dib itself).

In operation 510, the atmosphere of the headspace is displaced by introducing nonmetal oxide gas containing material into the package cavity (e.g., containing a MEMS device). This material includes a nonmetal oxide gas material (e.g., including gasses relatively easily dissolved in water for providing ionic species for generating acidic solutes). In an infused embodiment, the dib(s) are infused with nonmetal oxide gas before placing the infused dib into the package cavity. In an in-place embodiment, the dib(s) are placed (e.g., affixed) in the package cavity and infused (e.g., by a gas vapor process described below in operation 512) with the nonmetal oxide gas after being mounted in place. In the in-place embodiment, the enhanced concentrations of nonmetal oxide gas are maintained in the package cavity until the package is sealed in the subsequent operation 514. In a combined embodiment, dib(s) are infused with a nonmetal oxide gas before the dib(s) are placed in the package cavity and further exposed to a nonmetal oxide gas vapor after the dib(s) are place in the package cavity.

The operation 510 optionally includes a sequence of steps that facilitate the sealing of the package with the desired nonmetal oxide gas materials. These steps can include: placing the package (e.g., including the MEMS device and affixed dibs) into a vacuum/purge chamber, evacuating the air or other adventitious gasses from the headspace of the package cavity, and introducing nonmetal oxide gas containing materials to the headspace in desired (e.g., selectable) proportions through one or more purge valves. The gas content of the headspace can be maintained, such as by maintaining the package in the process chamber (e.g., the vacuum/purge chamber) until the package is sealed (in operation 514, described below). Although moisture (such as water, water vapor and humidity) is evacuated by the vacuum pump, adsorbed surface layers of water would normally still exist. Also, over the lifetime of the device, moisture can penetrate (e.g., gradually) seals of the package.

Accordingly, the dibs and the nonmetal oxide gases for providing ionic species for generating acidic solutes can be introduced at the same time or at different times. When the dibs and the nonmetal oxide gases (for providing ionic species for generating acidic solutes) are introduced at the same time, operations 510 and 512 (which is described below) are combined (e.g., so that operation 510 is not completed until at least some portion of operation 512 is performed). The nonmetal oxide gasses are selected from acid solutes sufficient to provide at least a 0.001 molar solution in water. The term "acidic solutes" can refer to either the nonmetal oxide gas itself (especially when introduced with noninfused dibs) and/or the combination of both the nonmetal oxide gas and dibs (e.g., infused dibs).

The polymer-zeolite mixture (e.g., in the form of one or more dibs) is conditioned in operation 512 to set the initial nonmetal acid content of the zeolite mixture. The conditioning process usually includes exposing the getter to the liquid or acidic vapor for a period of time to introduce the gas content into the polymer of the getter (e.g., so that during actual use of the MEMS device, the getter can act as a source and a sink of acid solute material).

After the period of time, the package is sealed (e.g., hermetically sealed) as indicated by operation 514, such as to prevent infiltration of moisture (e.g., from humidity in the surrounding atmosphere) and exfiltration of portions of the acid solute material. After the package is sealed, the package is heated, which promotes absorption of the gaseous acidic solute material by the desiccant compound of the getter.

FIG. 6 is a schematic diagram of an image projection system 600 using a micromirror 602 in accordance with example embodiments. In an embodiment, the micromirror 602 is a representative one of numerous mirrors within a MEMS device (such as MEMS device 206 of FIG. 2). In FIG. 6, light from light source 604 is focused on the improved micromirror 602 by lens 606. Although shown in FIG. 6 as a single lens, lens 606 is usually a group of lenses and/or filters, which together focus and direct light from the light source 604 onto the surface of the mirrors (such as micromirror device 602) within the MEMS device. Image data and control signals from controller 614 selectively cause some mirrors (within the MEMS device) to rotate to an "on" position and other mirrors (within the MEMS device) to rotate to an "off" position, thereby modulating the light by causing those mirrors to switch at various times between the "on" and "off" positions. In the "off" position, a mirror reflects light to a light trap 608. In the "on" position, a mirror reflects light to projection lens 610, which is shown as a single lens for simplicity. Projection lens 610 focuses the light modulated by the micromirror device 602 onto an image plane or screen 612. One or more micromirror devices 602 components are configured to move relative to one or more surrounding structures within the MEMS device. Example embodiments reduce the incidence of stiction in such moving components (as well as the corrosion of surfaces of the micromirror device 602).

In operation, light from light source 604 is focused on the improved micromirror 602 by lens 606, so that the improved micromirror 602 absorbs considerable amounts of heat. The cycles of application and removal of heat from the micromirror 602, as well as the repeated actuation of micromirror 602 result in expansion (e.g., mechanically or thermally induced expansion) and contraction of structures in the improved micromirror 602. The expansion and contraction of structures in the improved micromirror 602 promotes the formation of fissures, which usually results in autocatalytic degradation reactions in which the formation and growth of such fissures is greatly accelerated. Fissures are also caused by flexing beams (e.g., rotating mirrors) and are likewise subject to the autocatalytic degradation reactions. As described herein, the rates of corrosion and/or degradation reactions (such as in fissures) are slowed by the acidic and ionic species formed in the surface layers of water formed on exposed surfaces of the improved micromirror 602 (e.g., due to the inclusion of the easily soluble nonmetal oxide gasses included in the headspace of the package encapsulating the improved micromirror 602).

Modifications are possible in the described embodiments, and other embodiments are possible, within the scope of the claims.

What is claimed is:

1. A packaged MEMS device, comprising:
   a MEMS device;
   a sealed package enclosing the MEMS device; and
   a material including at least one nonmetal oxide gas at a level greater than 1.0% by volume disposed in the sealed package, the nonmetal oxide gas being mixed with helium, and a volume ratio of the helium to the nonmetal oxide gas ranging from 0.01 to 0.20.

2. The packaged MEMS device of claim 1, wherein the nonmetal oxide gas is selected from oxides of carbon, nitrogen, oxygen, sulfur, phosphorus and selenium.

3. The packaged MEMS device of claim 1, wherein the nonmetal oxide gas is carbon dioxide.

4. The packaged MEMS device of claim 1, wherein the nonmetal oxide gas solubility in water at room temperature is sufficient to provide at least a 0.001 molar solution in water.

5. The packaged MEMS device of claim 4, wherein a portion of the nonmetal oxide gas is contained by hydrogen bonds in a surface layer of moisture of an exposed surface of the MEMS device.

6. The packaged MEMS device of claim 5, wherein a portion of the hydrogen-bond-contained nonmetal oxide gas achieves a surface equilibrium concentration of ionic species through dissociation.

7. The packaged MEMS device of claim 5, wherein a portion of the hydrogen-bond-contained nonmetal oxide gas reduces localized charges in MEMS device structures by exchanging hydrogen bonds with the surface layer of moisture of an exposed surface of the MEMS device.

8. The packaged MEMS device of claim 5, wherein a portion of the hydrogen-bond-contained nonmetal oxide gas reduces van der Waals forces of contacting surface layers of moisture of the MEMS device.

9. The packaged MEMS device of claim 5, wherein a portion of the hydrogen-bond-contained nonmetal oxide gas reduces corrosion reaction rates of materials within the package of the MEMS device.

10. The packaged MEMS device of claim 5, wherein a portion of the hydrogen-bond-contained nonmetal oxide gas reduces localized charges in MEMS device structures, reduces van der Waals forces causing stiction of contacting surface layers of moisture of the MEMS device, and reduces corrosion reaction rates of materials within the surface of the MEMS device.

11. The packaged MEMS device of claim 5, wherein stiction forces between a first surface layer of moisture of a flexible beam of the MEMS device and a second surface layer of moisture of a dielectric of the MEMS device are reduced by a portion of the nonmetal oxide gas contained by the first and second surface layers.

12. The packaged MEMS device of claim 1, wherein the nonmetal oxide gas is furnished by a nonmetal oxide gas precursor disposed in the package before sealing.

13. The packaged MEMS device of claim 12, wherein the precursor comprises solid carbon dioxide.

14. A method, comprising:
   placing a MEMS device in a package;
   introducing a material including at least one nonmetal oxide gas at a level greater than 1.0% by volume in the package;
   introducing a helium level greater than standard atmospheric concentration in the package; and sealing the package, wherein surfaces of the MEMS device and package remain exposed to nonmetal oxide gas.

15. The method of claim 14, wherein the nonmetal oxide gas is selected from oxides of carbon, nitrogen, oxygen, sulfur, phosphorus and selenium.

16. The method of claim 14, wherein the nonmetal oxide gas is carbon dioxide.

17. The method of claim 16, wherein the nonmetal oxide gas solubility in water at room temperature is sufficient to provide at least a 0.001 molar solution in water.

18. A method, comprising:
placing a micromirror device in a package;
introducing a material including at least one nonmetal oxide gas at a level greater than 1% by volume in the package;
introducing a helium level greater than standard atmospheric concentration in the package; and
sealing the package.

19. The method of claim 18, comprising: testing the sealed package for helium escaping the sealed package.

20. A packaged MEMS device, comprising:
a MEMS device;
a sealed package enclosing the MEMS device;
a material including at least one nonmetal oxide gas at a level greater than 1.0% by volume disposed in the sealed package; and
a helium level greater than standard atmospheric concentration disposed in the sealed package.

21. The packaged MEMS device of claim 20, wherein the nonmetal oxide gas is selected from oxides of carbon, nitrogen, oxygen, sulfur, phosphorus and selenium.

22. The packaged MEMS device of claim 20, wherein the nonmetal oxide gas is carbon dioxide.

23. The packaged MEMS device of claim 20, wherein the nonmetal oxide gas solubility in water at room temperature is sufficient to provide at least a 0.001 molar solution in water.

24. The packaged MEMS device of claim 23, wherein a portion of the nonmetal oxide gas is contained by hydrogen bonds in a surface layer of moisture of an exposed surface of the MEMS device.

25. The packaged MEMS device of claim 24, wherein a portion of the hydrogen-bond-contained nonmetal oxide gas achieves a surface equilibrium concentration of ionic species through dissociation.

26. The packaged MEMS device of claim 24, wherein a portion of the hydrogen-bond-contained nonmetal oxide gas reduces localized charges in MEMS device structures by exchanging hydrogen bonds with the surface layer of moisture of an exposed surface of the MEMS device.

27. The packaged MEMS device of claim 24, wherein a portion of the hydrogen-bond-contained nonmetal oxide gas reduces van der Waals forces of contacting surface layers of moisture of the MEMS device.

28. The packaged MEMS device of claim 24, wherein a portion of the hydrogen-bond-contained nonmetal oxide gas reduces corrosion reaction rates of materials within the package of the MEMS device.

29. The packaged MEMS device of claim 24, wherein a portion of the hydrogen-bond-contained nonmetal oxide gas reduces localized charges in MEMS device structures, reduces van der Waals forces causing stiction of contacting surface layers of moisture of the MEMS device, and reduces corrosion reaction rates of materials within the surface of the MEMS device.

30. The packaged MEMS device of claim 24, wherein stiction forces between a first surface layer of moisture of a flexible beam of the MEMS device and a second surface layer of moisture of a dielectric of the MEMS device are reduced by a portion of the nonmetal oxide gas contained by the first and second surface layers.

31. The packaged MEMS device of claim 20, wherein the nonmetal oxide gas is furnished by a nonmetal oxide gas precursor disposed in the package before sealing.

32. The packaged MEMS device of claim 31, wherein the precursor comprises solid carbon dioxide.

* * * * *